(12) United States Patent
Nguyen

(10) Patent No.: US 6,617,935 B1
(45) Date of Patent: Sep. 9, 2003

(54) OSCILLATOR AND CURRENT SOURCE

(75) Inventor: Hung Nguyen, Fremont, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 0 days.

(21) Appl. No.: 09/507,219

(22) Filed: Feb. 18, 2000

(51) Int. Cl.[7] .............................................. H03B 5/00
(52) U.S. Cl. ......................... 331/57; 331/175; 326/93; 326/95; 365/233; 365/189.11
(58) Field of Search ...................... 331/57, 175; 326/93, 326/95; 365/233, 189.11

(56) References Cited

U.S. PATENT DOCUMENTS 5,359,301 A * 10/1994 Candage ...................... 331/57
5,544,120 A * 8/1996 Kuwagata et al. ........... 365/222
5,896,068 A * 4/1999 Moyal ...................... 331/177 R

* cited by examiner

Primary Examiner—Arnold Kinkead
(74) Attorney, Agent, or Firm—Gray Cary Ware & Freidenrich LLP

(57) ABSTRACT

An oscillator has a current source for generating a first signal connected to a plurality of odd numbered serially connected inverters. The current source comprises a resistor, and an NMOS transistor having a first terminal and a second terminal with a channel therebetween and a gate for controlling the current flow therebetween. The first terminal and the second terminal of the MOS transistor are connected in parallel with the resistor with a voltage connected to the gate of the MOS transistor to maintain the MOS transistor in a conduction state. The frequency output of such an oscillator would then be virtually independent of the voltage.

24 Claims, 3 Drawing Sheets

US 6,617,935 B1

OSCILLATOR AND CURRENT SOURCE

TECHNICAL FIELD

The present invention relates to an improved oscillator and more particularly to an oscillator having an improved current source such that the frequency of oscillation remains substantially constant at all voltages.

BACKGROUND OF THE INVENTION

Oscillators or timing devices are well known in the art. They are typically used with a charge pump to increase the voltage output of a charge pump for use in, e.g., non-volatile memory arrays. Thus, an oscillator in such an application must oscillate at a set frequency over a wide range of voltages.

In the prior art, as shown in FIG. 1, an oscillator 10 typically comprises two sections: a current source 12 and a plurality of odd numbered serially connected inverters 16. The current source 12 comprises a number of current paths with each path having a plurality of serially connected resistors 30a (or 30b, or 30c) connected to an associated PMOS transistor 32a (or 32b, or 32c) which acts as a switch to turn on the current path. Thus, the transistor 32a is turned on when the chip erase operation is performed and current flows from Vdd through the PMOS transistor 32a through the serially connected resistors 30a. Similarly, if a sector erase signal is activated, PMOS transistor 32b is activated causing current to flow from Vdd through the serially connected chain of resistors 30b. The current path flowing through the different resistors 30a, 30b, or 30c all flow through node 40.

The node 40 is connected to a plurality of odd numbered serially connected inverters 16(a–g). Each inverter, e.g. inverter 16a, comprises an input, e.g. 42a as the input to the inverter 16a, and an output e.g. 44a which is the output to the inverter 16a. The plurality of odd numbered serially connected inverters 16(a–g) are connected with an output of one inverter, e.g. 44a, connected to the input of an adjacent inverter, e.g. 42b. The output 44g of the last in the chain of serially connected inverters 16(a–g) is connected to the input 42a of the first inverter 16a.

Each inverter 16 further comprises a first PMOS transistor 18 having a source, a drain, and a gate for controlling the current flow between the source and drain all as well known in the art. In addition, each inverter comprises a first NMOS transistor 20 having a source, a drain, and a gate for controlling the flow of current therebetween. The gates of the first PMOS transistor 18 and the NMOS transistor 20 are connected together and to the input 42. The source of the NMOS transistor 20 is connected to the source of the PMOS transistor 18 and to the output 44 of the inverter 16. The drain of the PMOS transistor 18 is connected through a second PMOS transistor 48 and then to a source of voltage Vdd. The drain of the first NMOS transistor 20 is connected to the source of a second NMOS transistor 22 whose gate is connected to the node 40. Finally, the drain of the second NMOS transistor 22 is connected to ground.

Thus, all of the gates of the second NMOS transistors 22(a–g) are connected together and to the node 40 of the current source 12.

In the operation of the oscillator 10, once a signal, such as program, sector erase or chip erase is activated turning on PMOS transistor 32a, or 32b, or 32c, then current flows through the serially connected resistors 30a, 30b, or 30c to the node 40. At that point, a voltage appears at node 40 which turns on the second NMOS transistors 22(a–g). The odd number of serially connected inverters 16(a–g) then begin inverting and oscillating. Since there are an odd number of inverters 16, the inverters 16 will continually generate a stream of oscillating signals. The signals can then be outputted at node 60. The output of the signals at node 60 is shown graphically in FIG. 2.

As can be seen in FIG. 2, the period of oscillation for the oscillator 10 varies as a function of the voltage. In other words, the frequency of oscillation is slower at higher Vdd than at lower Vdd, where Vdd is the supply voltage of the circuit and is shown as the peak value of the waveforms in FIG. 2.

Thus, one of the problems with the prior art oscillator 10 is that the frequency of oscillation varies as a function of the voltage.

SUMMARY OF THE INVENTION

In the present invention, a current source for an oscillator comprises a resistor and an MOS transistor having a first terminal and a second terminal with a channel therebetween and a gate for controlling the current flow therebetween. The first terminal and the second terminal of the MOS transistor are connected in parallel with the resistor. A voltage is connected to the gate of the MOS transistor to maintain the MOS transistor in a conduction state. By having the MOS transistor in a conduction state connected in parallel with the resistor of the current source, variations of the frequency of oscillation as a function of voltage is substantially decreased.

DETAILED DESCRIPTION OF THE DRAWINGS

Figure 3:
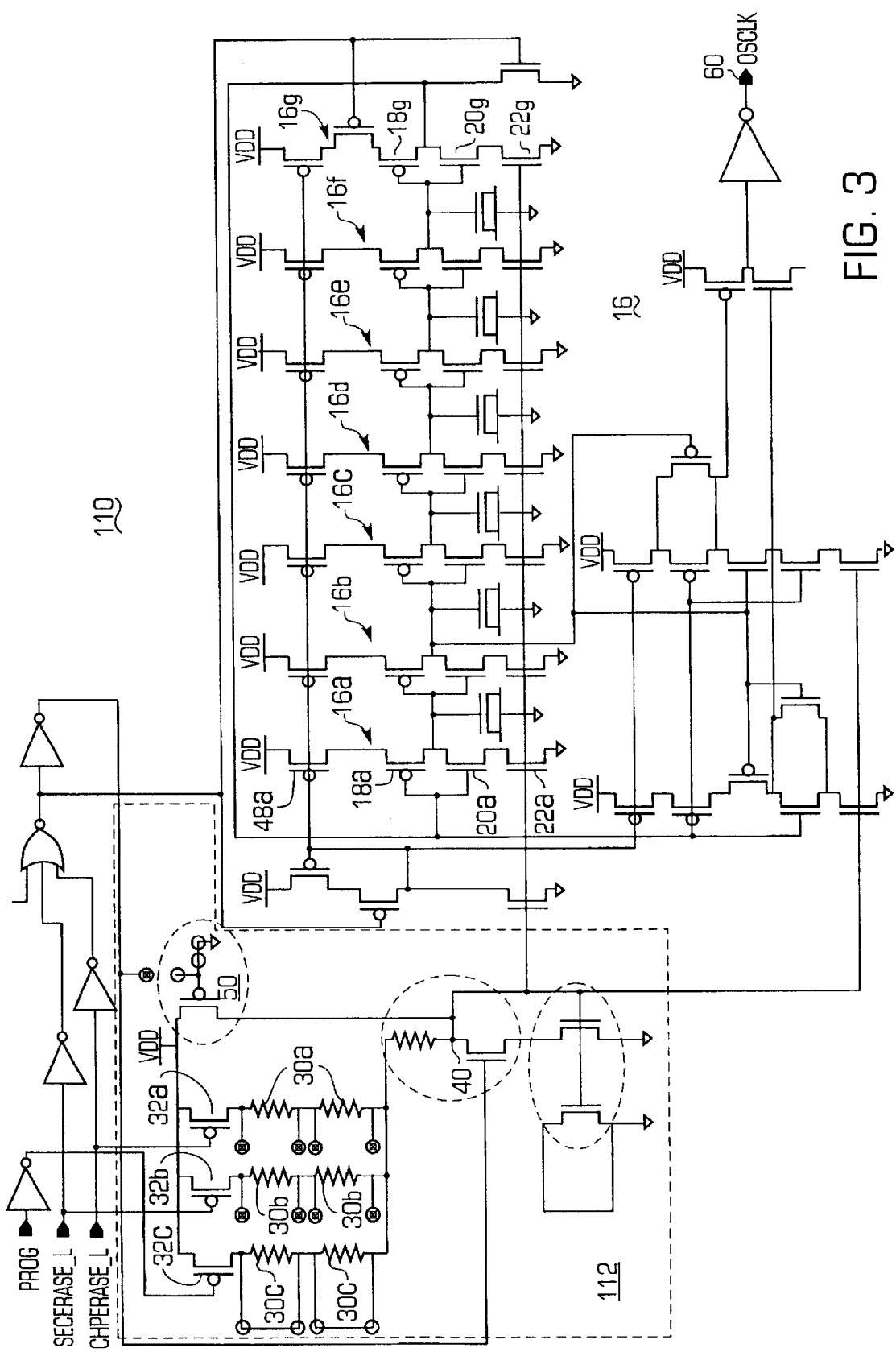
FIG. 3 is a detail circuit diagram of an improved oscillator of the present invention.

Referring to FIG. 3 there is shown a detailed circuit diagram of an improved oscillator 110 of the present invention. The improved oscillator 110 of the present invention is similar to the oscillator 10 of the prior art shown in FIG. 1 in that there is a current source 112 and a plurality of odd numbered serially connected inverters 16 comprising a plurality of inverters 16(a–g) exactly like the plurality of odd-numbered serially connected inverters 16 shown in FIG. 1.

The only difference between the improved oscillator 110 of the present invention and the oscillator 10 of the prior art lies in the current source 112 of the improved oscillator 110 of the present invention.

Figure 1:
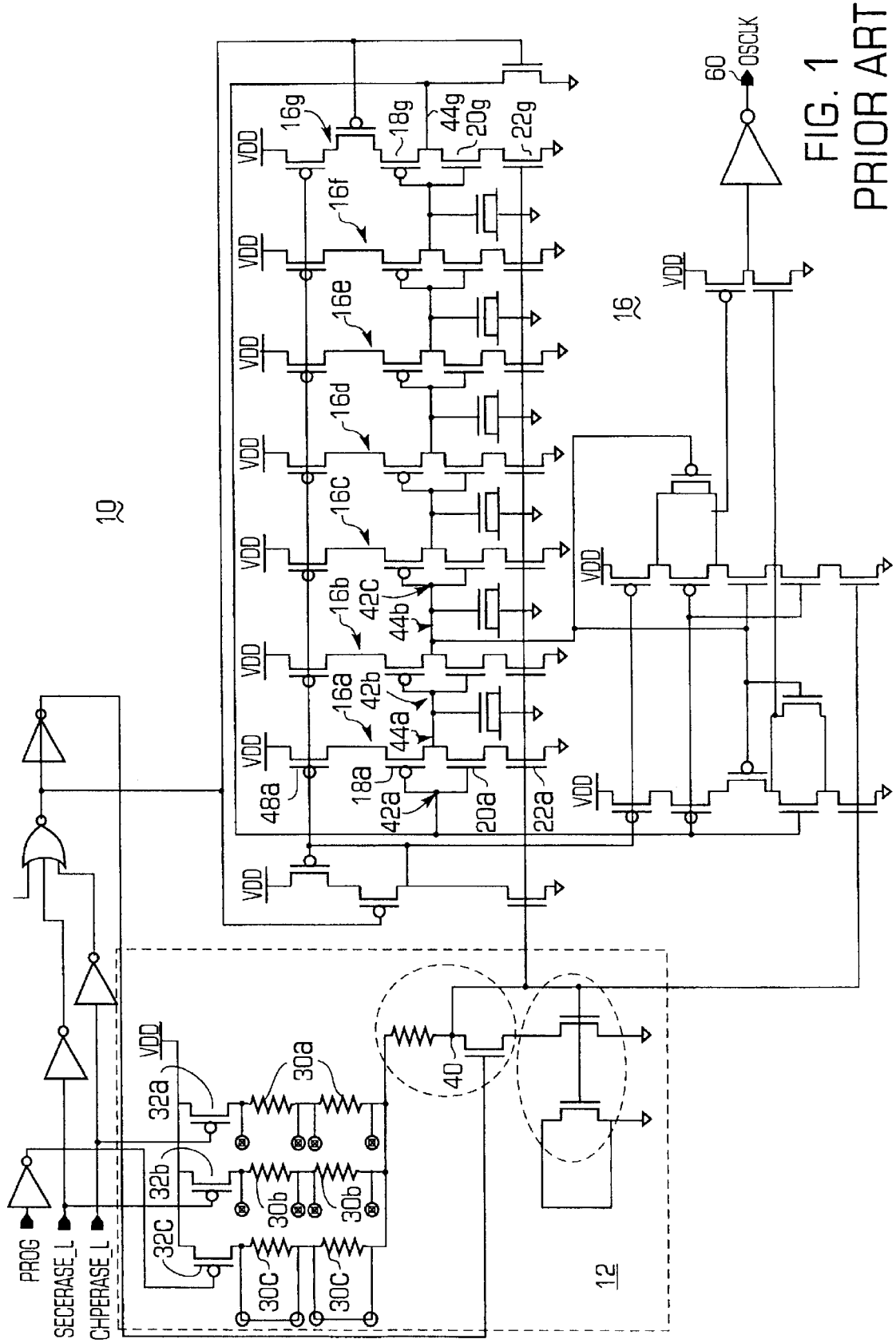
FIG. 1 is a detailed circuit diagram of an oscillator of the prior art.
Figure 2:
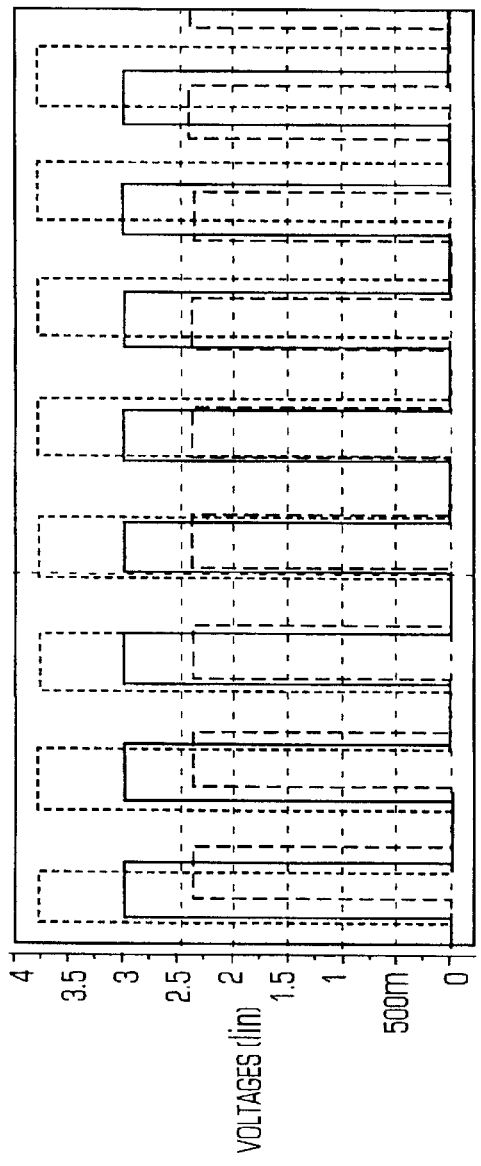
FIG. 2 is a graph of voltage vs. time showing the output of the oscillator of the prior art in which the frequency varies as a function of voltage.

The current source 112 is similar to the current source 12 shown in FIG. 1 in that it comprises a plurality of current paths from Vdd to node 40 which is connected to the plurality of odd numbered serially connected inverters 16. Each of the current paths comprises a PMOS transistor 32 connected in series with a series of resistors 30. Thus, PMOS transistor 32a is connected in series with resistors 30a to node 40. Another current path is from Vdd through PMOS transistor 32b through serially connected resistors 30b to node 40. Finally, similar to the current source 112 shown in FIG. 1, a current path flows from Vdd through PMOS transistor 32c through serially connected resistors 30c to node 40. Each of the PMOS transistors 32a, 32b, and 32c is activated by a different signal, e.g. chip erase to activate PMOS transistor 32a, sector erase to activate PMOS transistor 32b, and program to activate PMOS transistor 32c.

The difference between the current source 112 and the current source 12 shown in FIG. 1 is the addition of a PMOS transistor 50. The PMOS transistor 50 has a first terminal and a second terminal with a gate for controlling the current flow therebetween. The first terminal and the second terminal of the PMOS transistor 50 are connected in parallel with the resistors 30a, 30b, and 30c. A voltage is connected to the gate of the PMOS transistor 50, i.e. ground in order to maintain the MOS transistor 50 in a conduction state. Thus, at all times, a conducting PMOS transistor 50 is connected in parallel with one of the series of resistors 30a, 30b, or 30c in the current source 112.

Figure 4:
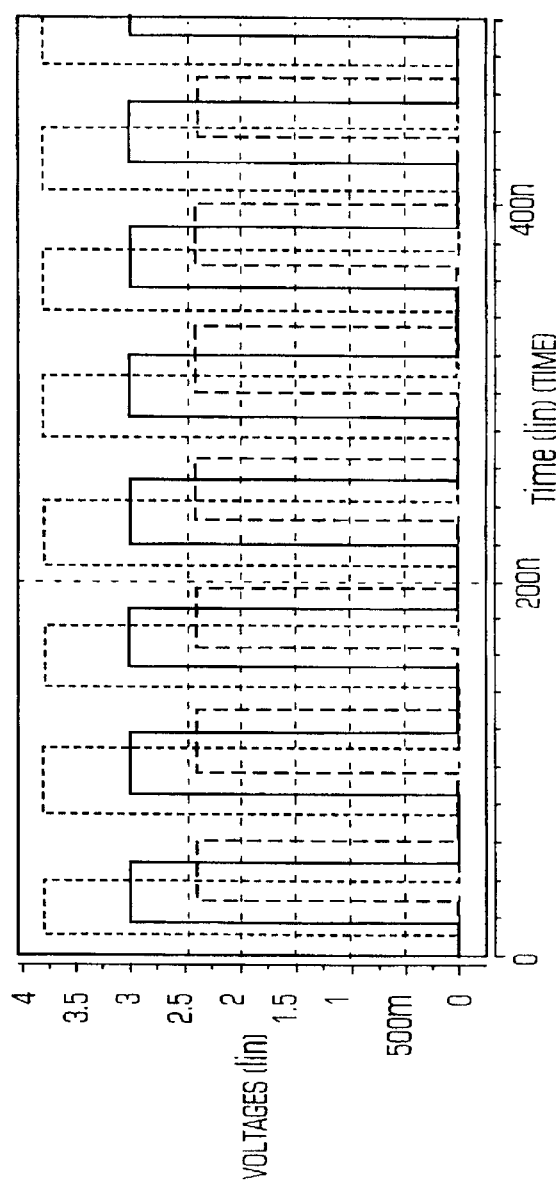
FIG. 4 is a graph of voltage vs. time showing the output of the improved oscillator of the present invention in which the frequency of oscillation does not vary substantially with voltage.

As a result of using a PMOS transistor 50 connected in parallel to the resistors 30a, 30b, or 30c, the output at node 60 shows the frequency of oscillation of the signal at node 60 being substantially constant through a variety of voltage conditions. This result is shown in FIG. 4.

It is believed that since the resistivity of the PMOS transistor 50 is not linear, at higher Vdd, it becomes less resistive and therefore more current can flow. At low Vdd, it has an increase in resistivity and therefore less current can flow. By having such a device in parallel with the resistors 30a, 30b, or 30c, the output at node 40 is substantially constant irrespective of Vdd.

Further, the PMOS transistor 50 can be replaced by an NMOS transistor whose gate is connected to a source of voltage which maintains the NMOS transistor in a conduction state.

Further, the resistors 30a, 30b, or 30c can be replaced by an inductance device such that at higher Vdd, higher resistivity occurs and at low Vcc lower resistivity occurs. This would compensate for the resistance vs. voltage effect of the PMOS (or NMOS) transistor 50 which at higher Vcc becomes less resistive and at low Vdd increases in resistivity. The parallel connection of these two devices would compensate one another resulting in a resistivity that is substantially constant over all ranges of Vdd.

What is claimed is:

1. A current source for an oscillator comprising:

a resistor;
    a MOS transistor having a first terminal and a second terminal with a channel therebetween, and a gate for controlling the current flow therebetween;
    said first terminal and second terminal connected in parallel with said resistor; and
    a first voltage connected to said gate to maintain said MOS transistor in a conduction state, said first voltage being constant or substantially equal to an applied voltage, the applied voltage being coupled to said first terminal said second terminal being at a second voltage that is above a ground voltage.

2. The current source of claim 1 wherein said MOS transistor is of P type and said first voltage is ground.

3. The current source of claim 1 wherein said MOS transistor is of N type and said first voltage is $V_{dd}$.

4. An oscillator comprising:

a current source comprising:
        a resistor;
        a MOS transistor having a first terminal and a second terminal with a channel therebetween, and a gate for controlling the current flow therebetween;
        said first terminal and second terminal connected in parallel with said resistor, said first terminal being connected to a first voltage, said second terminal being at a voltage greater than a ground voltage; and
        a second voltage connected to said gate to maintain said MOS transistor in a conduction state, said second voltage being constant or substantially equal to an applied voltage; and
    a plurality of odd numbered serially connected inverters, each inverter having an input and an output with the output of one inverter connected to the input of an adjacent inverter with the output of the last inverter connected to the input of the first inverter;
    each inverter comprising:
        a first PMOS transistor having a first terminal and a second terminal with a channel therebetween, and a gate for controlling the current flow therebetween;
        a first NMOS transistor having a first terminal and a second terminal with a channel therebetween, and a gate for controlling the current flow therebetween;
        said second terminal of said first PMOS transistor connected to the first terminal of said first NMOS transistor and forming said output; said gate of said first PMOS transistor connected to the gate of said fist NMOS transistor and forming said input;
        a second NMOS transistor having a first terminal and a second terminal with a channel therebetween, and a gate for controlling the current flow therebetween;
        said first terminal of said second NMOS transistor connected to the second terminal of said first NMOS transistor; and
        said gate of said second NMOS transistor of said plurality of inverters being connected together to said first terminal of said MOS transistor.

5. The oscillator of claim 4 wherein said MOS transistor is of P type and said second voltage is ground.

6. The oscillator of claim 4 wherein said MOS transistor is of N type and said second voltage is $V_{dd}$.

7. A current source for an oscillator comprising:

a first circuit element having a resistivity that increases in resistance as a function of the applied voltage;
    a second circuit element having a resistivity that decreases in resistance as a function of the applied voltage; and
    said first circuit element connected in parallel with said second circuit element and providing a signal to the oscillator,
    wherein said first circuit element is an inductor.

8. An oscillator comprising:

current source comprising:
        a first circuit element having a resistivity that increases in resistance as a function of the applied voltage;
        a second circuit element having a resistivity that decreases in resistance as a function of the applied voltage;
        said first circuit element connected in parallel with said second circuit element and providing a signal to the oscillator;

a plurality of odd numbered serially connected inverters, each inverter having an input and an output with the output of one inverter connected to the input of an adjacent inverter with the output of the last inverter connected to the input of the first inverter; each inverter comprising:

a first PMOS transistor having a first terminal and a second terminal with a channel therebetween, and a gate for controlling the current flow therebetween;

a first NMOS transistor having a first terminal and a second terminal with a channel therebetween, and a gate for controlling the current flow therebetween;

said second terminal of said first PMOS transistor connected to the first terminal of said first NMOS transistor and forming said output; said gate of said first PMOS transistor connected to the gate of said first NMOS transistor and forming said input;

a second NMOS transistor having a first terminal and a second terminal with a channel therebetween, and a gate for controlling the current flow therebetween;

said first terminal of said second NMOS transistor connected to the second terminal of said first NMOS transistor; and said gate of said second NMOS transistor of said plurality of inverters being connected together to said first terminal of said MOS transistor, wherein said first circuit element is an inductor.

9. A current source for an oscillator comprising:

at least one resistor circuit including a switch and a resistor coupled in series with said switch; and a MOS transistor having a first terminal connected to a supply voltage and a second terminal being at a voltage greater than a ground voltage and with a channel therebetween, and a gate for controlling the current flow therebetween, said at least one resistor circuit being connected in parallel to said first terminal and said second terminal, a voltage connected to said gate to maintain said MOS transistor being conductive independent of whether said switch is conductive.

10. The current source of claim 9 wherein said MOS transistor is of P type and said voltage is ground.

11. The current source of claim 9 wherein said MOS transistor is of N type and said voltage is Vdd.

12. An oscillator comprising:

a current source including:

at least one resistor circuit including a switch and a resistor coupled in series with said switch, and a MOS transistor having a first terminal connected to a supply voltage and a second terminal being at a voltage greater than a ground voltage with a channel therebetween, and a gate for controlling the current flow therebetween, said at least one resistor circuit being connected in parallel to said first terminal and said second terminal, a voltage connected to said gate to maintain said MOS transistor being conductive independent of whether said switch is conductive; and a plurality of odd numbered serially connected inverters, each inverter having an input and an output with the output of one inverter connected to the input of an adjacent inverter with the output of the last inverter connected to the input of the first inverter; each inverter comprising:

a first PMOS transistor having a first terminal and a second terminal with a channel therebetween, and a gate for controlling the current flow therebetween;

a first NMOS transistor having a first terminal and a second terminal with a channel therebetween, and a gate for controlling the current flow therebetween;

said second terminal of said first PMOS transistor connected to the first terminal of said first NMOS transistor and forming said output; said gate of said first PMOS transistor connected to the gate of said first NMOS transistor and forming said input;

a second NMOS transistor having a first terminal and a second terminal with a channel therebetween, and a gate for controlling the current flow therebetween;

said first terminal of said second NMOS transistor connected to the second terminal of said first NMOS transistor, and said gate of said second NMOS transistor of said plurality of inverters being connected together to said fist terminal of said MOS transistor.

13. The oscillator of claim 12 wherein said MOS transistor is of P type and said voltage is ground.

14. The oscillator of claim 12 wherein said MOS transistor is of N type and said voltage is Vdd.

15. The current source of claim 7 wherein said second circuit element is an MOS transistor having a first terminal and a second terminal with a channel therebetween, and a gate for controlling the current flow therebetween;

said first and second terminal connected in parallel with said first circuit element; and a voltage source connected to said gate to maintain said MOS transistor in a conduction state.

16. The current source of claim 15 wherein said MOS transistor is of P type and said voltage is ground.

17. The current source of claim 15 wherein said MOS transistor is of N type and said voltage is Vdd.

18. The oscillator of claim 8 wherein said second circuit element is an MOS transistor having a first terminal and a second terminal with a channel therebetween, and a gate for controlling the current flow therebetween;

said first and second terminal connected in parallel with said first circuit element; and a voltage source connected to said gate to maintain said MOS transistor in a conduction state.

19. The oscillator of claim 18 wherein said MOS transistor is of P type and said voltage is ground.

20. The oscillator of claim 18 wherein said MOS transistor is of N type and said voltage is Vdd.

21. A current source for an oscillator comprising:

a resistor;

a MOS transistor of P type having a first terminal connected to a supply voltage and a second terminal being at a voltage greater than a ground voltage and with a channel therebetween, and a gate for controlling the current flow therebetween connected to a ground voltage to maintain said MOS transistor in a conduction state; and said first terminal and second terminal connected in parallel with said resistor.

22. A current source for an oscillator comprising:

a resistor;

a MOS transistor of N type having a first terminal connected to a Vdd voltage and a second terminal being at a voltage greater than a ground voltage and with a channel therebetween, and a gate for controlling the current flow therebetween connected to said Vdd voltage to maintain said MOS transistor in a conduction state; and said first terminal and second terminal connected in parallel with said resistor.

23. An oscillator comprising:
a current source comprising:
  a resistor;
  a MOS transistor of P type having a first terminal connected to a supply voltage and a second terminal being at a voltage greater than a ground voltage and with a channel therebetween, and a gate for controlling the current flow therebetween connected to a ground voltage to maintain said MOS transistor in a conduction state, and
  said first terminal and second terminal connected in parallel with said resistor; and
  a plurality of odd numbered serially connected inverters, each inverter having an input and an output with the output of one inverter connected to the input of an adjacent inverter with the output of the last inverter connected to the input of the first inverter; each inverter comprising:
    a first PMOS transistor having a first terminal and a second terminal with a channel therebetween, and a gate for controlling the current flow therebetween;
    a first NMOS transistor having a first terminal and a second terminal with a channel therebetween, and a gate for controlling the current flow therebetween;
    said second terminal of said first PMOS transistor connected to the first terminal of said first NMOS transistor and forming said output; said gate of said first PMOS transistor connected to the gate of said first NMOS transistor and forming said input;
    a second NMOS transistor having a first terminal and a second terminal with a channel therebetween, and a gate for controlling the current flow therebetween;
    said first terminal of said second NMOS transistor connected to the second terminal of said first NMOS transistor; and
    said gate of said second NMOS transistor of said plurality of inverters being connected together to said first terminal of said MOS transistor.

24. An oscillator comprising:
a current source comprising:
  a resistor;
  a MOS transistor of N type having a first terminal connected to a supply voltage and a second terminal being at a voltage greater than a ground voltage and with a channel therebetween, and a gate for controlling the current flow therebetween connected to a Vdd voltage to maintain said MOS transistor in a conduction state, and
  said first terminal and second terminal connected in parallel with said resistor; and
  a plurality of odd numbered serially connected inverters, each inverter having an input and an output with the output of one inverter connected to the input of an adjacent inverter with the output of the last inverter connected to the input of the first inverter; each inverter comprising:
    a first PMOS transistor having a first terminal and a second thermal with a channel therebetween, and a gate for controlling the current flow therebetween;
    a first NMOS transistor having a first terminal and a second terminal with a channel therebetween, and a gate for controlling the current flow therebetween;
    said second terminal of said first PMOS transistor connected to the first terminal of said first NMOS transistor and forming said output; said gate of said first PMOS transistor connected to the gate of said first NMOS transistor and forming said input;
    a second NMOS transistor having a first terminal and a second terminal with a channel therebetween, and a gate for controlling the current flow therebetween;
    said first terminal of said second NMOS transistor connected to the second terminal of said first NMOS transistor; and
    said gate of said second NMOS transistor of said plurality of inverters being connected together to said first terminal of said MOS transistor.

* * * * *